US008737527B2

(12) United States Patent
Lozhkin

(10) Patent No.: US 8,737,527 B2
(45) Date of Patent: May 27, 2014

(54) COMPOSITE AMPLIFIER, TRANSMITTER, AND COMPOSITE AMPLIFIER CONTROL METHOD

(75) Inventor: Alexander N Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 166 days.

(21) Appl. No.: 13/307,872

(22) Filed: Nov. 30, 2011

(65) Prior Publication Data

US 2012/0177143 A1    Jul. 12, 2012

(30) Foreign Application Priority Data

Jan. 7, 2011    (JP) ................................. 2011-002479

(51) Int. Cl.
*H04K 1/02* (2006.01)

(52) U.S. Cl.
USPC .......................................... 375/297; 375/295

(58) Field of Classification Search
USPC ....................................................... 375/297
See application file for complete search history.

(56) References Cited

U.S. PATENT DOCUMENTS

| | | | |
|---|---|---|---|
| 5,966,048 A * | 10/1999 | Thompson ................. | 330/124 R |
| 6,111,462 A | 8/2000 | Mucenieks et al. | |
| 6,342,810 B1 * | 1/2002 | Wright et al. .................... | 330/51 |
| 6,381,212 B1 * | 4/2002 | Larkin ............................ | 370/210 |
| 6,452,526 B2 * | 9/2002 | Sagawa et al. ................ | 341/144 |
| 7,139,539 B2 * | 11/2006 | Chun ......................... | 455/127.1 |
| 7,254,377 B2 | 8/2007 | Maruyama et al. | |
| 2003/0214355 A1 * | 11/2003 | Luz et al. .................. | 330/124 R |
| 2004/0014500 A1 * | 1/2004 | Chun ............................ | 455/561 |
| 2007/0071120 A1 * | 3/2007 | Talwar .......................... | 375/260 |
| 2010/0111157 A1 * | 5/2010 | Sawai ........................... | 375/232 |
| 2012/0314800 A1 * | 12/2012 | Akutagawa et al. .......... | 375/295 |

FOREIGN PATENT DOCUMENTS

JP    2003-032055    1/2003

OTHER PUBLICATIONS

"Digital Predistorter Reference Design", Altera Application Note 314, Jul. 2003, pp. 1-46.
Ilkka, Hakala et al., "A 2.14-GHz Chireix Outphasing Transmitter", IEEE Trans on Microwave Theory and Techniques, vol. 53, No. 6, Jun. 2005, pp. 2129-2138.
P, Jardin et al., "Filter Look Up Table method for Power Amplifier Linearization", IEEE Transactions on Instrumentation and Measurment, 2007, vol. 56, MUMB 3, Oct. 2003, pp. 1076-1087 (pp. 1-12).
Paloma, García et al., "An Adaptive Digital Method of Imbalances Cancellation in LINC Transmitters", IEEE Transactions on Vehicular Technology, vol. 54, No. 3, May 2005, pp. 879-888.
Qureshi, Jawad H. et al.,"90-W Peak Power GaN Outphasing Amplifier With Optimum Input Signal Conditioning", IEEE Trans on Theory and Techniques, 2009, vol. 57, No. 8, Jan. 27, 2009, pp. 1925-1935.
Edmund, W. C. et al., "A Mixed Signal Approach Towards Linear and Efficient N-Way Doherty Amplifiers", IEEE Trans on Microwave Theory and Techniques, vol. 55, No. 5, May 2007, pp. 866-879.

* cited by examiner

*Primary Examiner* — Santiago Garcia
(74) *Attorney, Agent, or Firm* — Fujitsu Patent Center

(57) ABSTRACT

A signal distributor sequentially outputs N input signals respectively corresponding to N rows of a matrix of which each has N element signals in which a predetermined matrix is obtained by dividing the matrix by a predetermined value. A coupler adds the amplified N element signals for each the input signal. A solver computes feedback signals Y* for the individual amplifiers by using an addition result Y of the outputs for each the input signal and the inverse matrix $L^{-1}$ of the predetermined matrix.

5 Claims, 10 Drawing Sheets

COMPOSITE AMPLIFIER, TRANSMITTER, AND COMPOSITE AMPLIFIER CONTROL METHOD

CROSS-REFERENCE TO RELATED APPLICATION

This application is based upon and claims the benefit of priority of the prior Japanese Patent Application No. 2011-002479, filed on Jan. 7, 2011, the entire contents of which are incorporated herein by reference.

FIELD

The embodiment discussed herein is directed to a composite amplifier, a transmitter, and a composite amplifier control method.

BACKGROUND

A mobile radio terminal has been recently widespread. Furthermore, a demand for fast data services of the mobile radio terminal is expanding. Along with these recent situations, it has become much more important to increase the transmission output power of a base station. A high power amplifier (HPA) is used for increasing to increase the transmission output power of a base station. Moreover, the high power amplifier requires high power efficiency in addition to the increase of transmission output power. Therefore, a composite high power amplifier (C-HPA) having a plurality of HPAs has been introduced to amplify transmission output power and further raise power efficiency. When a base station employs C-HPA, there is also an advantage that input signals can be uniformly amplified. The C-HPA includes, for example, an amplifier using an outphasing method and a Doherty amplifier. An outphasing method means an amplification method for performing linear amplification by using nonlinear components that is called LINC (Linear Amplification with Nonlinear Components). A Doherty amplifier means an amplifier that simultaneously activates two amplifiers during high power operation and activates only one amplifier during low power operation.

In order to achieve high power efficiency, these high power amplifiers are often driven into a nonlinear region that causes intermodulation distortion. Nonlinearities in the HPAs distort signals, thereby causing EVM (Error Vector Magnitude) and BER (Bit Error Rate) degradations. Therefore, various distortion compensation techniques have been proposed in order to satisfy both of power efficiency and linearity of a high power amplifier. A digital predistortion (DPD) technique is one of distortion compensation techniques that could lead to more efficient and cost-effective high power amplifiers.

FIG. 10 is a diagram explaining a conventional example of a DPD-type C-HPA. In FIG. 10, the C-HPA includes amplifiers 301 to 303, tap couplers 311 to 313, a coupler 320, subtracters 331 to 333, LMS (Least Mean Square) processors 341 to 343, multipliers 351 to 353, and an antenna 360. Hereinafter, when the amplifiers 301 to 303 are not distinguished, they are simply referred to as "amplifiers 300". When the tap couplers 311 to 313 are not distinguished, they are simply referred to as "tap couplers 310". When the subtracters 331 to 333 are not distinguished, they are simply referred to as "subtracters 330". When the LMS processors 341 to 343 are not distinguished, they are simply referred to as "LMS processors 340". When the multipliers 351 to 353 are not distinguished, they are simply referred to as "multipliers 350". Although only the three amplifiers 300 are illustrated in the present embodiment, the C-HPA of FIG. 10 may actually have the N amplifiers 300. The amplifier 303 corresponds to the N-th amplifier. In this case, the number of the tap couplers 310 corresponding to the individual amplifiers 300 is "N". Similarly, the number of the subtracters 330 is "N", the number of the LMS processors 340 is "N", and the number of the multipliers 350 is "N".

As illustrated in FIG. 10, signals y*i (i=1 to N) output from of the individual amplifiers 300 are input into the tap couplers 310. The individual tap couplers 310 return the signals y*i into signal levels before amplification and output the returned signals to the subtracters 330 as feedback signals y*i. Then, the individual subtracters 330 subtract the feedback signals y*i from input signals xi (i=1 to N) to obtain error signals. Then, the individual subtracters 330 output the obtained error signals to the LMS processors 340. The individual LMS processors 340 perform an LMS process on the error signals input from the subtracters 330 to compute correction (predistortion) signals hi (i=1 to N). Then, the individual LMS processors 340 output the correction signals hi to the multipliers 350. The individual multipliers 350 multiply the input signals xi by the correction signals hi. In this case, because each of the signals xi is a complex I/Q signal of which the real part is an I-signal and the imaginary part is a Q-signal, each of the multipliers 350 actually performs complex multiplication. In this manner, inverse characteristics of distortion characteristics of the individual amplifiers 300 are added to the input signals xi by multiplying the input signals xi by the correction signals hi. As a result, because distortion caused by each the amplifier 300 is canceled, a signal without distortion is output from each the amplifier 300. The coupler 320 then couples signals without distortion output from the individual amplifiers 300 to generate an output signal. Then, the generated output signal is output from the antenna 360.

Patent literature 1: Japanese Laid-open Patent Publication No. 2003-32055

Patent literature 2: U.S. Pat. No. 6,111,462

Non-Patent literature 1: Qurehi j. H. et al, "90-W Peak Power GaN Outphasing Amplifier With Optimum Input Signal Conditioning", IEEE Trans On Theory And Techniques, 2009, vol. 57, No. 8, pp. 1925-1935

Non-Patent literature 2: Altera Application Note 314, "Digital predistorter reference design"

Non-Patent literature 3: Ilkka Hakala et al, "A 2.14-GHz Chireix Outphasing Transmitter", IEEE Trans On Microwave Theory And Techniques, Vol. 53, No. 6, June 2005

Non-Patent literature 4: W. C. Edmund et al, "A Mixed Signal Approach Towards Linear And Efficient N-Way Doherty Amplifiers", IEEE Trans On Microwave Theory And Techniques, Vol. 55, No. 5, May 2007

Non-Patent literature 5: Paloma Garcla, Jesus de Mingo, Member, IEEE, Antonio Valdovios, and Alfonso Ortega, "An Adaptive Digital Method of Imbalances Cancellation in LINC Transmitters", IEEE TRANSACTIONS ON VEHICULAR TECHNOLOGY, Vol. 54, No. 3, MAY 2005

Non-Patent literature 6: P. Jardin and G. Baudoin, "Filter Look Up Table method for Power Amplifier Linearization," IEEE TRANSACTIONS ON INSTRUMENTATION AND MEASUREMENT, 2007, Vol. 56, MUMB 3, pages 1076-1087

The conventional DPD type C-HPA sends signals output from individual HPAs to subtracters as feedback signals by using tap couplers. In this manner, when the signals output from the individual HPAs are used as feedback signals by using the tap couplers, MMIC (Monolithic Microwave Integrated Circuit) generates excess outputs so as to increase the cost and size and deteriorate the C-HPA reliability. An additional problem with tap couplers implementation is that the tap couplers placed at the outputs of the individual HPAs have insulation and thus they are suffered from the mutual coupling between the outputs of the individual HPAs.

On the contrary, when tap couplers are not used, only a signal that is obtained by coupling the outputs of the individual HPAs can be acquired as the output of the C-HPA. In general, it is difficult to acquire the outputs of the individual HPAs by analyzing the output of the C-HPA and thus it is difficult to find out correction signals hi (i=1 to N) corresponding to transfer functions fi of the individual HPAs.

SUMMARY

According to an aspect of an embodiment of the invention, a composite amplifier includes an signal distributor that sequentially outputs N input signals respectively corresponding to N rows of a matrix of which each has N element signals in which a predetermined matrix is obtained by dividing the matrix by a predetermined value; N amplifiers that sequentially receive the N input signals to amplify and output the respective amplified N element signals of each of the N input signals; a signal adder that adds the amplified N element signals for each the input signal; a feedback signal computer that computes feedback signals for the amplifiers by using an addition result of the outputs for each the input signal and an inverse matrix of the predetermined matrix; and a corrector that corrects signal distortions of the amplifiers by using the feedback signals.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

Moreover, the composite amplifier, the transmitter, and the composite amplifier control method disclosed in the present application are limited to the embodiments explained below.

[a] First Embodiment

Figure 1:
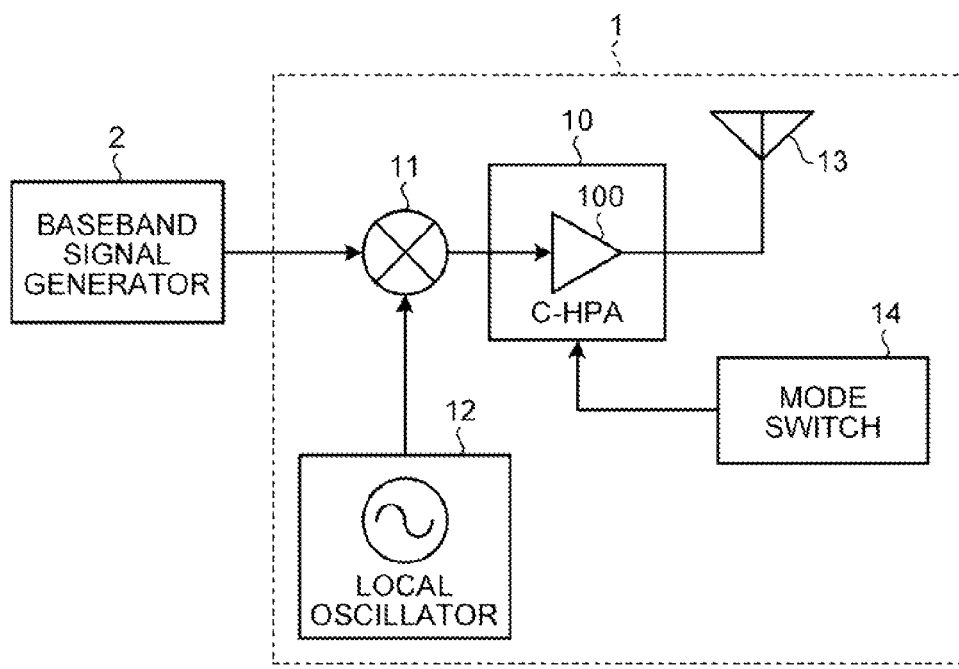
FIG. 1 is a diagram illustrating the entire configuration of a transmitter.

FIG. 1 is a diagram illustrating the entire configuration of a transmitter 1. As illustrated in FIG. 1, the transmitter 1 according to the present embodiment includes a composite high power amplifier (hereinafter, "C-HPA") 10, a multiplier 11, a local oscillator 12, an antenna 13, and a mode switch 14. First, it will be explained about the overall operations of the transmitter 1 according to the present embodiment with reference to FIG. 1. After that, it will be explained in detail about distortion compensation that is performed by the C-HPA 10 according to the present embodiment.

A baseband signal generator 2, which may be realized by a processor such as Digital Signal Processor (DSP), generates a baseband signal on the basis of input data such as a voice. Then, the baseband signal generator 2 outputs the generated baseband signal to the transmitter 1.

The multiplier 11 receives the baseband signal from the baseband signal generator 2. Furthermore, the multiplier 11 receives a locally-generated signal from the local oscillator 12. Then, the multiplier 11 multiplies the baseband signal by the carrier frequency of the locally-generated signal to convert its frequency and generates an RF signal. Then, the multiplier 11 outputs the generated RF signal to the C-HPA 10.

The C-HPA 10 includes an amplifier 100. Although only one amplifier is illustrated in FIG. 1, the amplifier 100 actually consists of a plurality of amplifiers that is arranged in parallel. The C-HPA 10 receives the RF signal from the multiplier 11. Then, the C-HPA 10 amplifies the RF signal by using the amplifier 100. At this time, although the C-HPA 10 performs a distortion compensation process, their descriptions are omitted. The operations of the C-HPA 10 will be explained in detail below. The C-HPA 10 transmits the amplified signal through the antenna 13. The C-HPA 10 corresponds to an example of a "composite amplifier".

The transmitter 1 according to the present embodiment has a feedback signal computation mode and a signal transmission mode. The mode switch 14 switches the mode of the transmitter 1.

Figure 2:
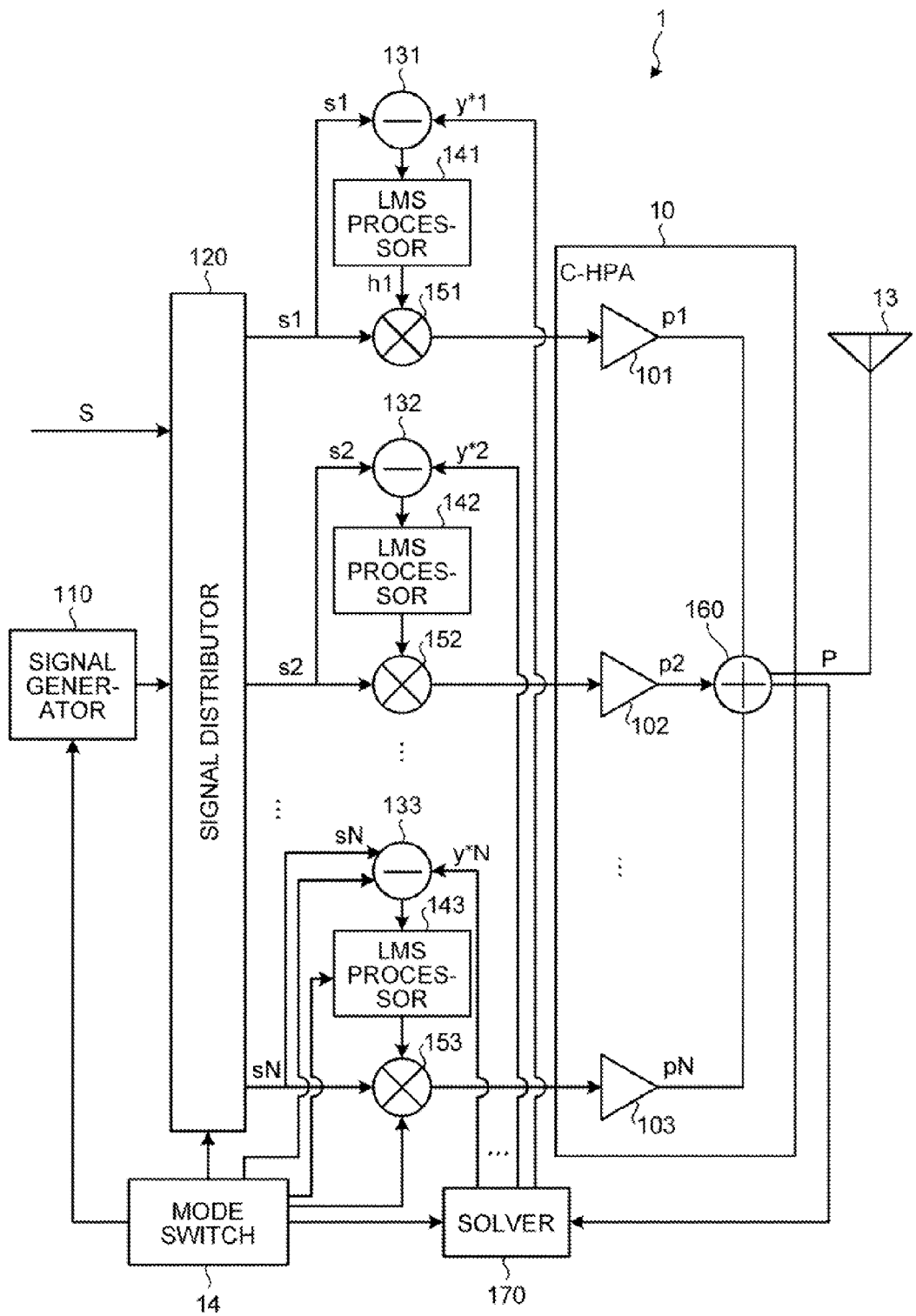
FIG. 2 is a block diagram illustrating C-HPA according to a first embodiment.
Figure 3:
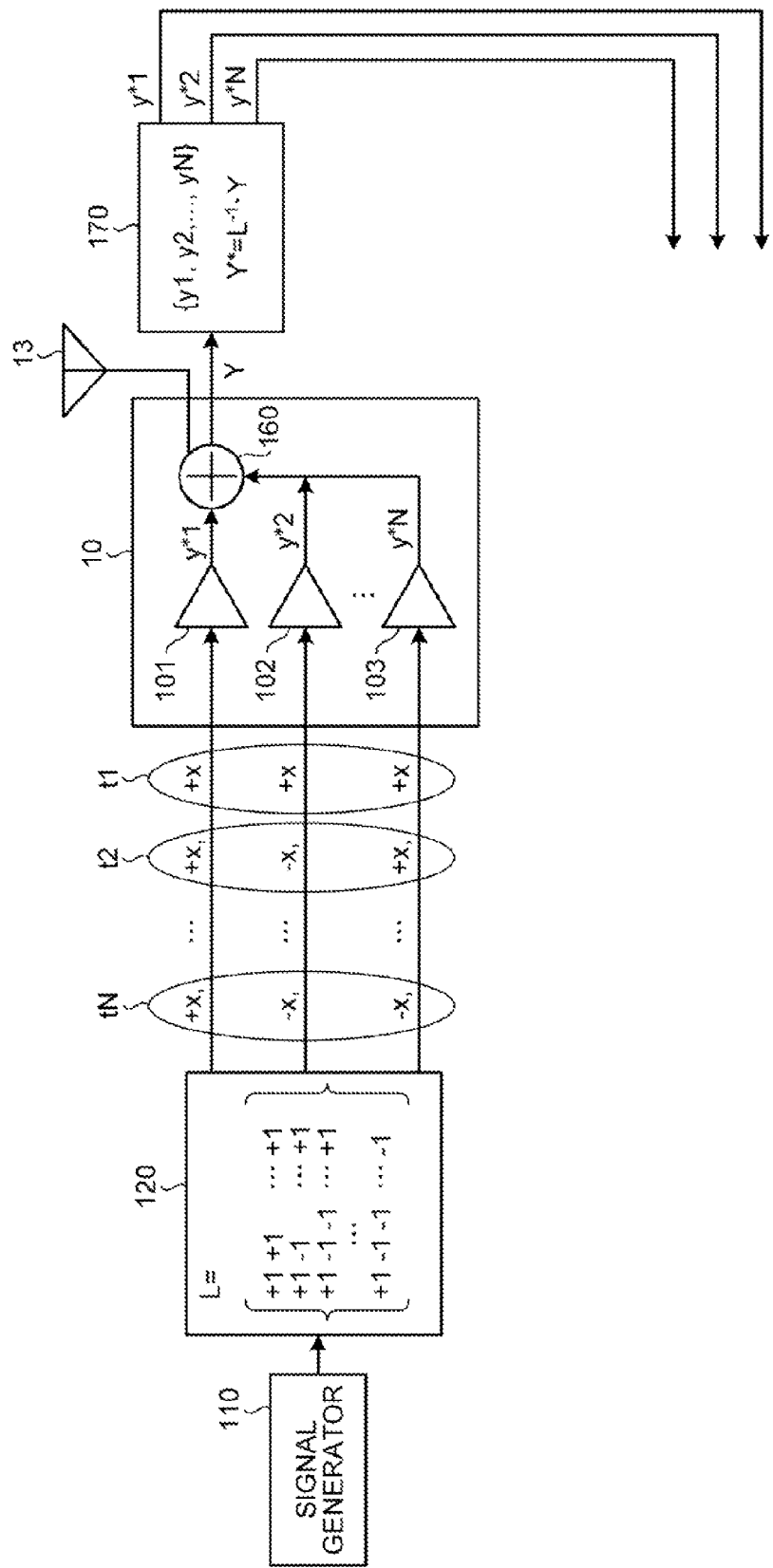
FIG. 3 is a schematic diagram explaining a feedback signal computation process that is performed by the C-HPA according to the first embodiment.

FIG. 2 is a block diagram of the C-HPA 10 according to the first embodiment. FIG. 3 is a schematic diagram explaining a feedback signal computation process that is performed by the C-HPA 10 according to the first embodiment.

In this case, although only three amplifiers are illustrated in FIG. 2, the C-HPA 10 of the transmitter 1 according to the present embodiment includes N (N≥2) amplifiers 101 to 103. The amplifier 103 corresponds to the N-th amplifier. Hereinafter, when the amplifiers 101 to 103 are not distinguished, they are simply referred to as the "amplifier 100". The amplifiers 101 to 103 are an example of "1st to N-th amplifiers". The C-HPA 10 further includes a coupler 160.

The transmitter 1 according to the present embodiment includes a signal generator 110, a signal distributor 120, and the antenna 13. The transmitter 1 according to the present embodiment further includes subtracters 131 to 133, LMS processors 141 to 143, and multipliers 151 to 153. Hereinafter, when the subtracters 131 to 133 are not distinguished, they are simply referred to as "subtracters 130". When the LMS processors 141 to 143 are not distinguished, they are simply referred to as "LMS processors 140". When the multipliers 151 to 153 are not distinguished, they are simply referred to as "multipliers 150". In this case, although the three subtracters 130, the three LMS processors 140, and the three multipliers 150 are illustrated in FIG. 2, the number of the subtracters 130, the number of the LMS processors 140, and the number of the multipliers 150 are actually "N" to correspond to the number of the amplifiers 100. Therefore, the subtracter 133 is the N-th subtracter, the LMS processor 143 is the N-th LMS processor, and the multiplier 153 is the N-th multiplier. In FIG. 2, in order to make one easily see the drawing, signal lines of the mode switch 14 are connected to only the subtracter 133, the LMS processor 143, and the multiplier 153, as an example. However, signal lines of the mode switch 14 are actually connected to the "N" subtracters 130, the "N" LMS processors 140, and the "N" multipliers 150. Hereinafter, it will be first explained about a feedback signal computation mode and then about a signal transmission mode.

Feedback Signal Computation Mode

It will be explained about a feedback signal computation process that is performed by the C-HPA 10 according to the present embodiment with reference to FIG. 3. In FIG. 3, a symbol "+" is added to "x" and "1" for easier comprehension. The following descriptions may omit the symbol "+" in some cases.

The mode switch 14 switches the mode of the signal generator 110, the signal distributor 120, the subtracters 130, the LMS processors 140, the multipliers 150, and a solver 170 into a feedback signal computation mode.

The signal generator 110 generates signals X={x1, x2, ..., xN} that are signals for feedback signal computation. Then, the signal generator 110 sequentially inputs the signals X={x1, x2, ..., xN} into the signal distributor 120 at times ti (1≤i≤N, t1<t2< ... <tN). This means that the inputs of the signals xi at the times ti are sequentially repeated until the signal xN is input at the time tN in such a manner that the signal x1 is input at the time t1 and the signal x2 is input at the time t2. The signal x1 is a signal that is generated to be distributed by the signal distributor 120 like x1={x, x, ..., x} (x is a predetermined value that is not zero). The signal xk (2≤k≤N) is a signal that is generated to be distributed by the signal distributor 120 in such a manner that the first value is x and the 2nd to k-th values are −x. For example, the signal x2 is a signal that is generated to be distributed by the signal distributor 120 like x2={x, −x, ..., x}. The signal xN is a signal that is generated to be distributed by the signal distributor 120 like xN={x, −x, ..., −x}. These signals x1 to xN are an example of "1st to N-th signals". In this case, if x is not zero, the predetermined value x is not particularly limited.

Now, it will be specifically explained about the transmission of the signals X. In the case of the transmission of data, the transmitter 1 transmits a preamble placed on a header part of the data and then transmits actual contents of the data. Therefore, the signal generator 110 inserts the signals X into a preamble when transmitting data and transmits the signals X to the signal distributor 120. In this manner, because the signals X that are signals for feedback signal computation are placed on the preamble of data, the computation of a feedback signal can be performed before data transmission and thus the distortion compensation of the individual amplifiers 100 can be appropriately performed.

The signal distributor 120 sequentially receives the signals X from the signal generator 110. Then, the signal distributor 120 distributes the received signals. Specifically, the signal distributor 120 distributes the signal x1 like {x, x, ..., x}. Moreover, the signal distributor 120 distributes the signal xk in such a manner that the first value is x and the 2nd to k-th values are −x.

A distribution method of a signal performed by the signal distributor 120 is, for example, an outphasing method.

Then, the signal distributor 120 sequentially outputs the j-th values of the distributed signals to the j-th amplifier 100. For example, when x1 is input from the signal generator 110, the signal distributor 120 distributes x1 like {x, x, ..., x} and outputs the distributed values to the 1st to N-th amplifiers 100. In this case, the outputs to the individual amplifiers 100 are indicated by values surrounded with an area t1 illustrated in FIG. 3. Moreover, when xk is input from the signal generator 110, the signal distributor 120 outputs "x" to the 1st and (k+1)th to N-th amplifiers 100 and outputs "−x" to the 2nd to k-th amplifiers 100. Specifically, when x2 is input from the signal generator 110, the signal distributor 120 outputs "−x" to the amplifier 102 and outputs "x" to the amplifiers 101 and 103 other than the amplifier 102. In this case, the outputs to the individual amplifiers 100 are indicated by values surrounded with an area t2 illustrated in FIG. 3. Moreover, when xN is input from the signal generator 110, the signal distributor 120 outputs "x" to the amplifier 101 and outputs "−x" to the amplifiers 102 and 103 other than the amplifier 101. In this case, the outputs to the individual amplifiers 100 are indicated by values surrounded with an area tN illustrated in FIG. 3.

In the feedback signal computation mode of the present embodiment, the subtracters 130 and the LMS processors 140 are not activated. Moreover, the individual multipliers 150 only allows the passage of the signals output from the signal distributor 120 to transfer the signals to the amplifiers 100. In this case, the signals output from the signal distributor 120 are actually input into the individual amplifiers 100 via the multipliers 151 to 153. However, because the multipliers 151 to 153 only transfer the signals, the multipliers 151 to 153 are not illustrated in FIG. 3 for convenience of explanation.

In this case, a matrix "L" is an N*N matrix that is created by arraying N elements of xi on the i-th row and dividing the arrayed elements by "x". Specifically, the matrix L is expressed by the next mathematical expression (1).

$$L = \begin{Bmatrix} +1 & +1 & & \ldots & +1 \\ +1 & -1 & & \ldots & +1 \\ +1 & -1 & -1 & \ldots & +1 \\ & & \ldots & & \\ +1 & -1 & -1 & \ldots & -1 \end{Bmatrix} \quad (1)$$

The 1st to N-th amplifiers 100 receive the signals that are sequentially input from the signal distributor 120. Then, the individual amplifiers 100 amplify and output the input signals. In this case, assuming that a function indicating the amplification of the amplifier 100 is f(x), the output of the j-th amplifier 100 when x is input from the signal distributor 120 is expressed by y*j=f(x). The function "f" is a nonlinear transfer function. If it is y*=f(x), the function "f" satisfies −y*=f(−x). In other words, if a value assigned to the function "f" has an inverse symbol, its solution has an inverse symbol. Therefore, when signals of which the specific signal has an inverse symbol are input, the individual amplifiers 100 output values of which the corresponding specified value has an inverse symbol. In other words, when a signal "x" is input, the j-th amplifier 100 outputs y*j (1≤j≤N). On the other hand, when a signal "−x" is input, the j-th amplifier 100 outputs −y*j. For example, when the signals x1={x, x, ..., x} are input, the individual amplifiers 101 to 103 output y*1 to y*N.

When the signals x2={x, −x, . . . , x} are input, the amplifier 102 outputs −y*2 and the individual amplifiers 101 and 103 other than the amplifier 102 output y*1, y*3 to y*N. Moreover, when the signals xN={x, −x, . . . , −x} are input, the amplifier 101 outputs y*1 and the amplifiers 102 to 103 output −y*2 to −y*N. In this case, it is assumed that a vector that is obtained by arraying the outputs y*j in order is Y. In other words, Y*={y*1, y*2, . . . , y*N}.

The coupler 160 receives the outputs y*j output from the individual amplifiers 100 that correspond to the signals xi input from the signal distributor 120. Then, the coupler 160 couples the received outputs y*j and sequentially generates outputs yi (1≤i≤N) corresponding to the signals xi input from the signal distributor 120. In other words, the outputs for the signals xi input at the times ti are yi. Specifically, an output for the signal x1 input at the time t1 is y1=y*1+y*2+ . . . +y*N. Moreover, an output for the signal xk input at the time tk (2≤k≤N) is yk=y*1−y*2−y*k+y*(k+1) . . . +y*N. For example, an output for the signal x2 input at the time t2 is y2=y*1−y*2+y*3+ . . . +y*N. Moreover, an output for the signal xN input at the time tN is yN=y*1−y*2−y*3− . . . −y*N. In this case, it is assumed that a vector that is obtained by arraying these outputs y1 to yN in order is "Y". In other words, Y={y1, y2, . . . , yN}. Then, the coupler 160 outputs the signals Y to the solver 170.

The solver 170 previously stores therein $L^{-1}$ that is an inverse matrix of the matrix L. The solver 170 receives the signals Y from the coupler 160.

In this case, Y and Y* satisfy the next mathematical expression (2).

$$Y^* = L^{-1}Y \quad (2)$$

Therefore, the solver 170 computes $L^{-1}Y$ by using the $L^{-1}$ and the input Y={y1, y2, . . . , yN} to obtain Y*={y*1, y*2, . . . , y*N}.

In this case, it is assumed that the obtained value Y*j is a feedback signal that is used for computing a correction signal for distortion compensation of the j-th amplifier 100. Then, the solver 170 transmits the feedback signal y*j to the j-th subtracter 130 corresponding to the j-th amplifier 100. For example, the solver 170 transmits the feedback signal y*1 to the subtracter 131, transmits the feedback signal y*2 to the subtracter 132, and transmits the feedback signal y*N to the subtracter 133. The solver 170 is an example of a "feedback signal computer".

The individual subtracters 130 receive the feedback signals from the solver 170. Then, the individual subtracters 130 store the received feedback signals. The subtracter 130 is an example of an "error signal computer".

Figure 4:
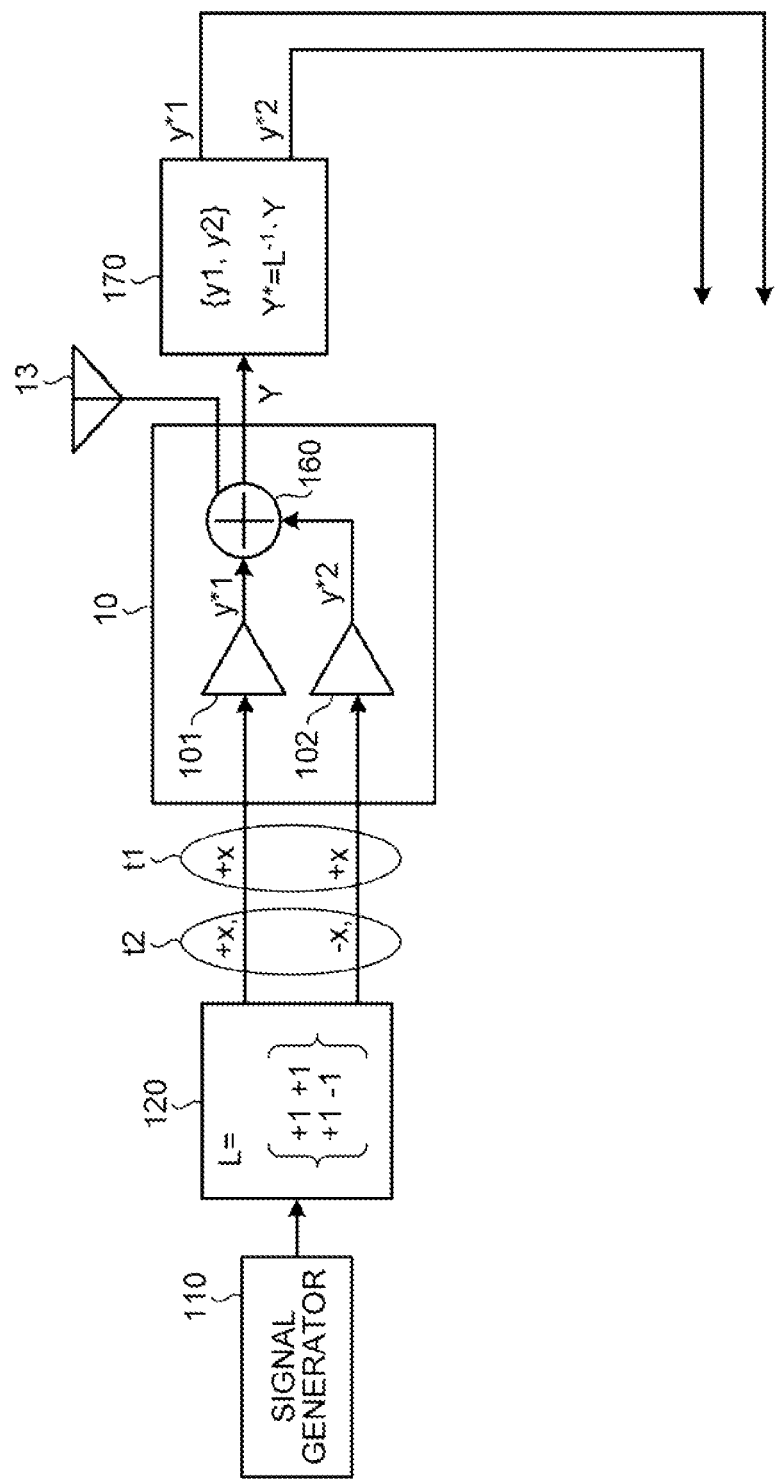
FIG. 4 is a schematic diagram explaining a feedback signal computation process that is performed by the C-HPA when the C-HPA has two amplifiers according to the first embodiment.

Now, it will be further explained about a specific example of feedback signal computation with reference to FIG. 4. FIG. 4 is a schematic diagram explaining a feedback signal computation process that is performed by the C-HPA when the C-HPA has two amplifiers according to the first embodiment. In FIG. 4, a symbol "+" is added to "x" and "1" for easier comprehension. However, the following descriptions may omit the symbol "+" in some cases.

When the C-HPA includes two amplifiers of the amplifier 101 and the amplifier 102, the signal generator 110 generates a signal x1 that is distributed by the signal distributor 120 like {x, x} and a signal x2 that is distributed by the signal distributor 120 like {x, −x}. Then, the signal generator 110 outputs the signal x1 to the signal distributor 120 at the time t1 and outputs the signal x2 to the signal distributor 120 at the time t2.

First, the signal distributor 120 receives the signal x1 from the signal generator 110. Then, the signal distributor 120 divides the signal x1 into {x, x}. Then, the signal distributor 120 inputs "x" into the amplifier 101 and inputs "x" into the amplifier 102. These inputs are indicated by values surrounded with the area t1. Next, the signal distributor 120 receives the signal x2 from the signal generator 110. Then, the signal distributor 120 divides the signal x2 into {x, −x}. Then, the signal distributor 120 inputs "x" into the amplifier 101 and inputs "−x" into the amplifier 102. These inputs are indicated by values surrounded with the area t2. In this case, the matrix L is expressed by the next mathematical expression (3).

$$L = \begin{Bmatrix} +1 & +1 \\ +1 & -1 \end{Bmatrix} \quad (3)$$

In this case, both of the amplifier 101 and the amplifier 102 receive "x" from the signal distributor 120. Then, the amplifier 101 amplifies the input "x" and outputs y*1. The amplifier 102 amplifies the input "x" and outputs y*2.

Next, the amplifier 101 receives "x" from the signal distributor 120 and the amplifier 102 receives "−x" from the signal distributor 120. Then, the amplifier 101 amplifies the input "x" and outputs y*1. The amplifier 102 amplifies the input "−x" and outputs −y*2.

In this case, the coupler 160 receives y*1 from the amplifier 101 and receives y*2 from the amplifier 102. Then, the coupler 160 couples y*1 and y*2 to generate y1. Then, the coupler 160 outputs y1 to the solver 170.

Next, the coupler 160 receives y*1 from the amplifier 101 and receives −y*2 from the amplifier 102. Then, the coupler 160 couples y*1 and −y*2 to generate y2. Then, the coupler 160 outputs y2 to the solver 170.

The solver 170 receives y1 and y2 from the coupler 160. Then, the solver 170 computes Y*={y*1, y*2} by using Y={y1, y2} and $L^{-1}$. Specifically, the solver 170 computes Y* like the next mathematical expression (4).

$$\begin{Bmatrix} y^*1 \\ y^*2 \end{Bmatrix} = \begin{Bmatrix} +0.5 & +0.5 \\ +0.5 & -0.5 \end{Bmatrix} \begin{Bmatrix} y1 \\ y2 \end{Bmatrix} \quad (4)$$

In other words, the solver 170 computes Y*1=0.5*y1+0.5*y2 and y*2=0.5*y1−0.5*y2. The solver 170 outputs the computed y*1 as a feedback signal for calculating the correction signal of the amplifier 101. Moreover, the solver 170 outputs the computed y*2 as a feedback signal for calculating the correction signal of the amplifier 102.

On the other hand, when the amplifier 100 includes, for example, three amplifiers (N=3), in other words, when the matrix "L" is a 3*3 matrix, the matrix "L" is expressed by the next mathematical expression (5).

$$L = \begin{Bmatrix} +1 & +1 & +1 \\ +1 & -1 & +1 \\ +1 & -1 & -1 \end{Bmatrix} \quad (5)$$

Its inverse matrix "$L^{-1}$" is expressed by the next mathematical expression (6).

$$L^{-1} = \begin{pmatrix} +0.5 & 0 & +0.5 \\ +0.5 & +0.5 & 0 \\ 0 & +0.5 & +0.5 \end{pmatrix} \quad (6)$$

Therefore, in the case of N=3, the solver 170 can compute feedback signals y*1, y*2, and y*3 by using the inverse matrix "$L^{-1}$" of the matrix "L" expressed by the mathematical expression (6).

Signal Transmission Mode

Returning to FIG. 2, it will be explained about an operation of each unit that is performed in a signal transmission mode. The mode switch 14 switches the mode of the signal generator 110, the signal distributor 120, the subtracters 130, the LMS processors 140, the multipliers 150, and the solver 170 into a signal transmission mode.

The signal generator 110 stops the generation of a signal and the output of the generated signal.

The signal distributor 120 receives a signal "S" that is an RF signal from the multiplier 11. Then, the signal distributor 120 divides the received signal "S" into N signals. In the present embodiment, the signal distributor 120 divides the signal "S" into s1 to sN signals. The signal distributor 120 outputs the divided signals to the subtracters 130 and the multipliers 150. Specifically, the signal distributor 120 outputs the signal s1 to the subtracter 131 and the multiplier 151. The signal distributor 120 outputs the signal s2 to the subtracter 132 and the multiplier 152. The signal distributor 120 outputs the signal sN to the subtracter 133 and the multiplier 153.

Next, it will be explained about operations of the subtracters 130, the LMS processors 140, and the multipliers 150. Particularly, it is explained about operations of the subtracter 131, the LMS processor 141, and the multiplier 151 that correspond to the amplifier 101.

The subtracter 131 receives the signal s1 from the signal distributor 120. Then, the subtracter 131 subtracts the feedback signal y*1 stored in the feedback signal computation mode from the signal s1 to obtain an error signal. Then, the subtracter 131 outputs the obtained error signal to the LMS processor 141.

The LMS processor 141 receives the error signal from the subtracter 131. Then, the LMS processor 141 performs an LMS process on the received error signal to compute a correction (predistortion) signal h1. Then, the LMS processor 141 outputs the correction signal h1 to the multiplier 151.

The multiplier 151 receives the signal s1 from the signal distributor 120. The multiplier 151 further receives the correction signal h1 from the LMS processor 141. Then, the multiplier 151 multiplies the input signal s1 by the correction signal h1. In this manner, an inverse characteristic of a distortion characteristic of the amplifier 101 is added to the signal s1 by multiplying the signal s1 by the correction signal h1. Then, the multiplier 151 outputs the signal s1 to the amplifier 101, to which the inverse characteristic of the distortion characteristic is added.

The amplifier 101 receives the signal s1 from the multiplier 151, to which the inverse characteristic of the distortion characteristic is added. Then, the amplifier 101 amplifies the signal s1 to which the inverse characteristic of the distortion characteristic is added to generate a signal p1. In this manner, distortion occurring in the amplifier 101 is canceled by amplifying a signal to which an inverse characteristic of a distortion characteristic is added, and thus the signal p1 without distortion is output from the amplifier 101. Then, the amplifier 101 outputs the signal p1 to the coupler 160.

The coupler 160 acquires signals p1 to pN without distortion that are output from the individual amplifiers 100. Then, the coupler 160 couples the signals p1 to pN to generate a transmitting signal P. Then, the coupler 160 transmits the transmitting signal P through the antenna 13.

Figure 5:
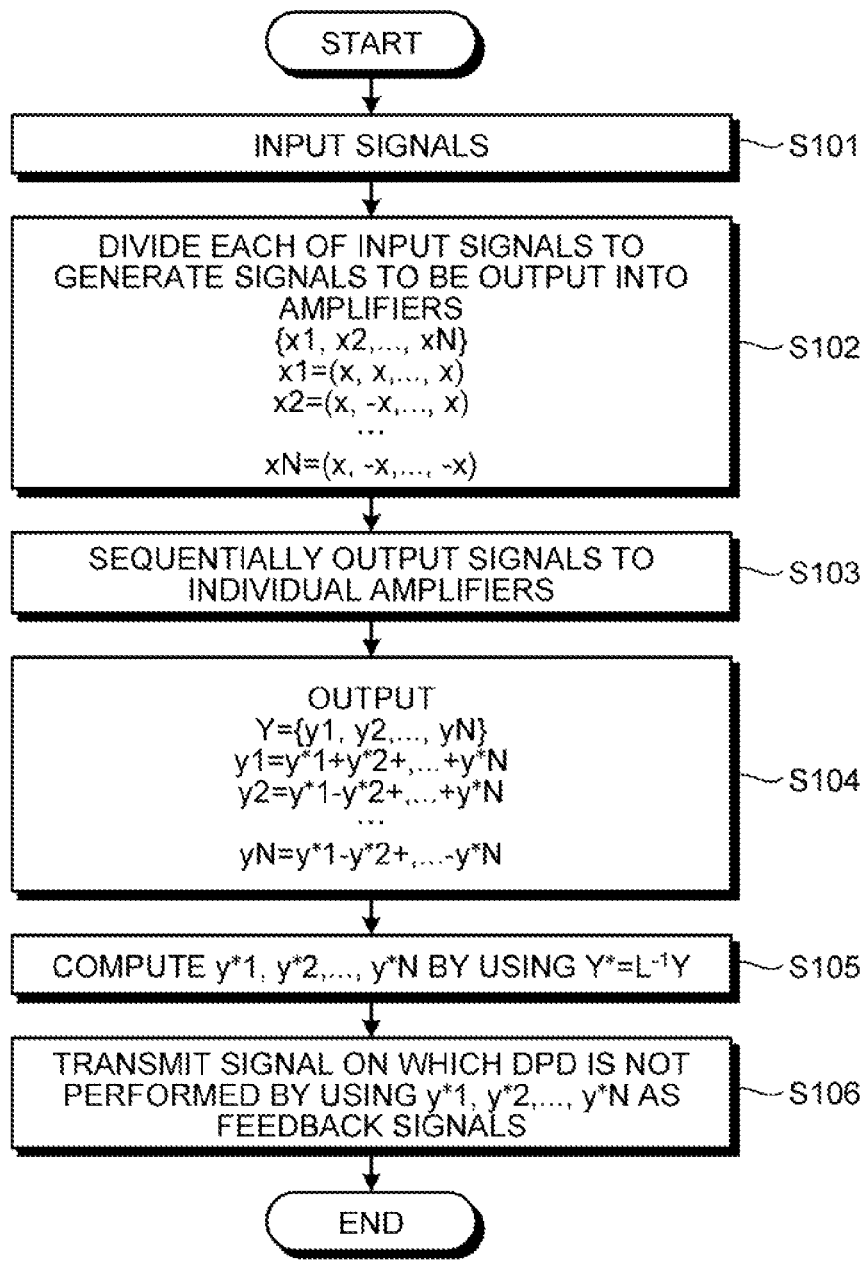
FIG. 5 is a flowchart explaining a distortion compensation process that is performed by the C-HPA according to the first embodiment.

Next, it will be explained about a flow of a distortion compensation process that is performed by the C-HPA according to the present embodiment with reference to FIG. 5. FIG. 5 is a flowchart explaining a distortion compensation process that is performed by the C-HPA according to the first embodiment.

In FIG. 5, Steps S101 to S105 correspond to a feedback signal computation mode process and Step S106 corresponds to a signal transmission mode process. However, the processes are explained as a series of processes without switching an operation mode for convenience of explanation.

The signal generator 110 generates signals X={x1, x2, ..., xN}. Then, the signal generator 110 sequentially inputs the signals X={x1, x2, ..., xN} into the signal distributor 120 at times ti ($1 \leq t2 \leq N$, t1<t2<, ..., <tN) (Step S101).

The signal distributor 120 divides each of the input signals x1, x2, ..., xN to generate signals to be output to the individual amplifiers 100. Specifically, the signal distributor 120 generates signals like x1=(x, x, ..., x), x2=(x, -x, ..., x), and xN=(x, -x, ..., -x) (Step S102).

Then, the signal distributor 120 outputs the divided signals, in the order of inputting from x1 to xN, to the individual amplifiers 100 (Step S103).

The individual amplifiers 100 amplify and output the input signals. At this time, the j-th ($1 \leq j \leq N$) amplifier 100 outputs y*j when the input is "x" and outputs -y*x when the input is "-x". Then, the coupler 160 couples the signals input from the individual amplifiers 100 and outputs the coupled signal to the solver 170. Specifically, when the output of the signal generator 120 is the signal x1, the coupler 160 outputs y1=y*1+y*2+...+y*N. On the other hand, when the output of the signal generator 120 is the signal xk ($2 \leq k \leq$), the coupler 160 outputs yk=y*1-y*2-y*k+y*(k+1)+...+y*N. After all, the coupler 160 outputs Y={y1, y2, ..., yN} to the solver 170 (Step S104).

The solver 170 receives the signals Y={y1, y2, ..., yN} from the coupler 160 to compute feedback signals y*1, y*2, ..., y*N by using Y*=$L^{-1}$Y (Step S105). Then, the solver 170 transmits the feedback signals to the individual subtracters 130.

The i-th ($1 \leq i \leq N$) subtracter 130 subtracts the feedback signal y*i from the signal si input from the signal distributor 120 to obtain an error signal. The i-th LMS processor 140 performs an LMS process on the error signal to compute a correction (predistortion) signal hi. Then, the LMS processor 140 outputs the correction signal hi to the i-th multiplier 150. The i-th multiplier 150 multiplies the input signal xi by the correction signal hi. Then, the i-th amplifier 100 amplifies the signal input from the multiplier 150 to generate a signal pi. Then, the coupler 160 couples the signals p1 to pN input from the individual amplifiers 100 to generate a transmitting signal P. Then, the coupler 160 transmits the transmitting signal P through the antenna 13 (Step S106).

As described above, the C-HPA according to the present embodiment can obtain the outputs of the individual HPAs on the basis of the output signal of the C-HPA after coupling the outputs of the individual amplifiers that are arranged therein. As a result, because it is not required that tap couplers for using the outputs of the individual HPAs as feedback signals are arranged even when a DPD technique is used, the size of C-HPA can be reduced, a manufacturing cost can be suppressed, and further reliability can be improved. Moreover, because DPD is used, power efficiency can be improved while retaining the linearity of a high power amplifier. In other words, according to the C-HPA of the present embodiment, the reduction of a size, the reduction of a manufacturing cost, and the improvement of reliability can be realized without losing linearity and power efficiency of a high power amplifier.

[b] Second Embodiment

Figure 6:
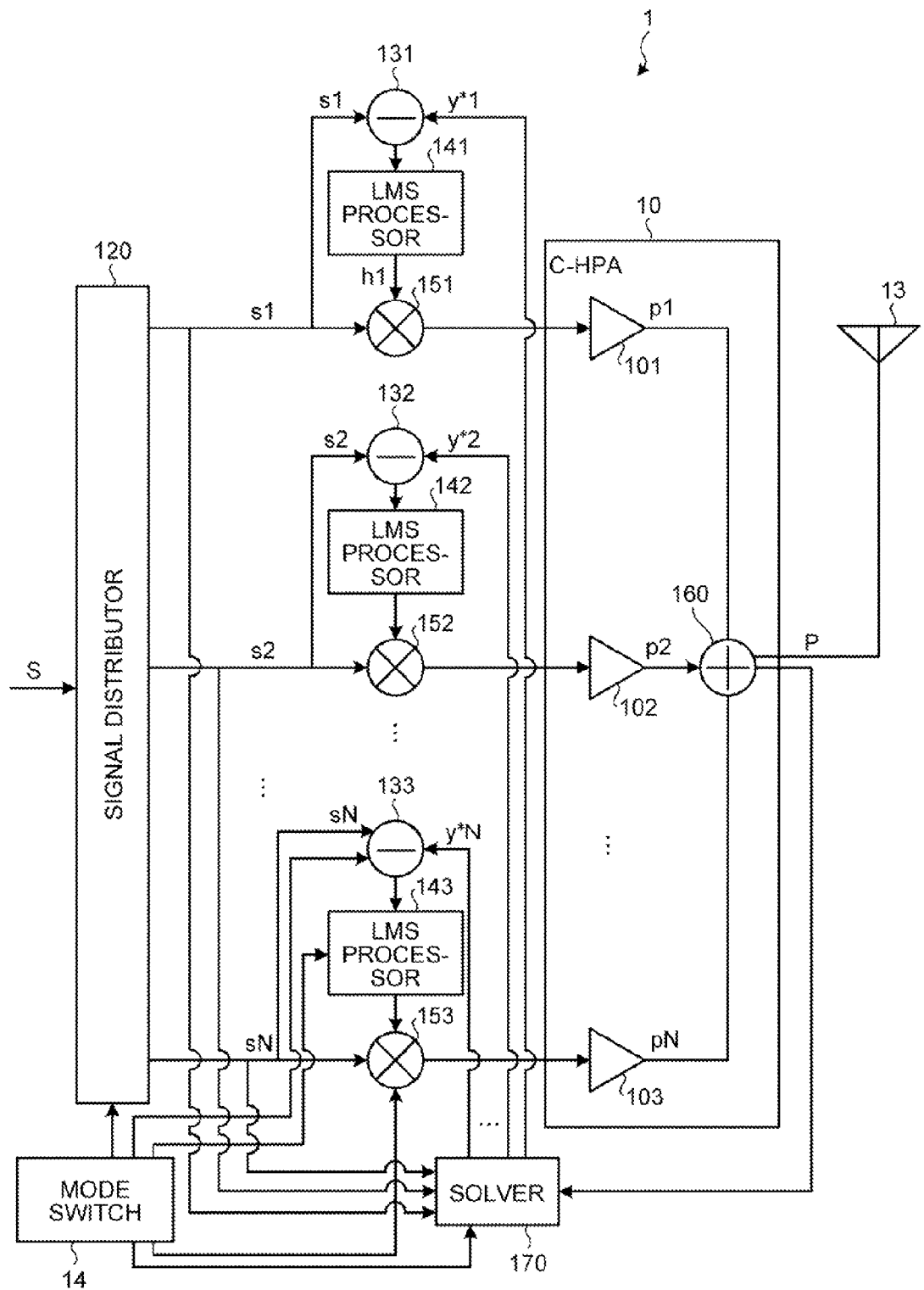
FIG. 6 is a block diagram illustrating C-HPA according to a second embodiment.

FIG. 6 is a block diagram of C-HPA according to the second embodiment. As illustrated in FIG. 6, the C-HPA according to the present embodiment does not include the signal generator 110 unlike the C-HPA of the first embodiment.

Figure 7:
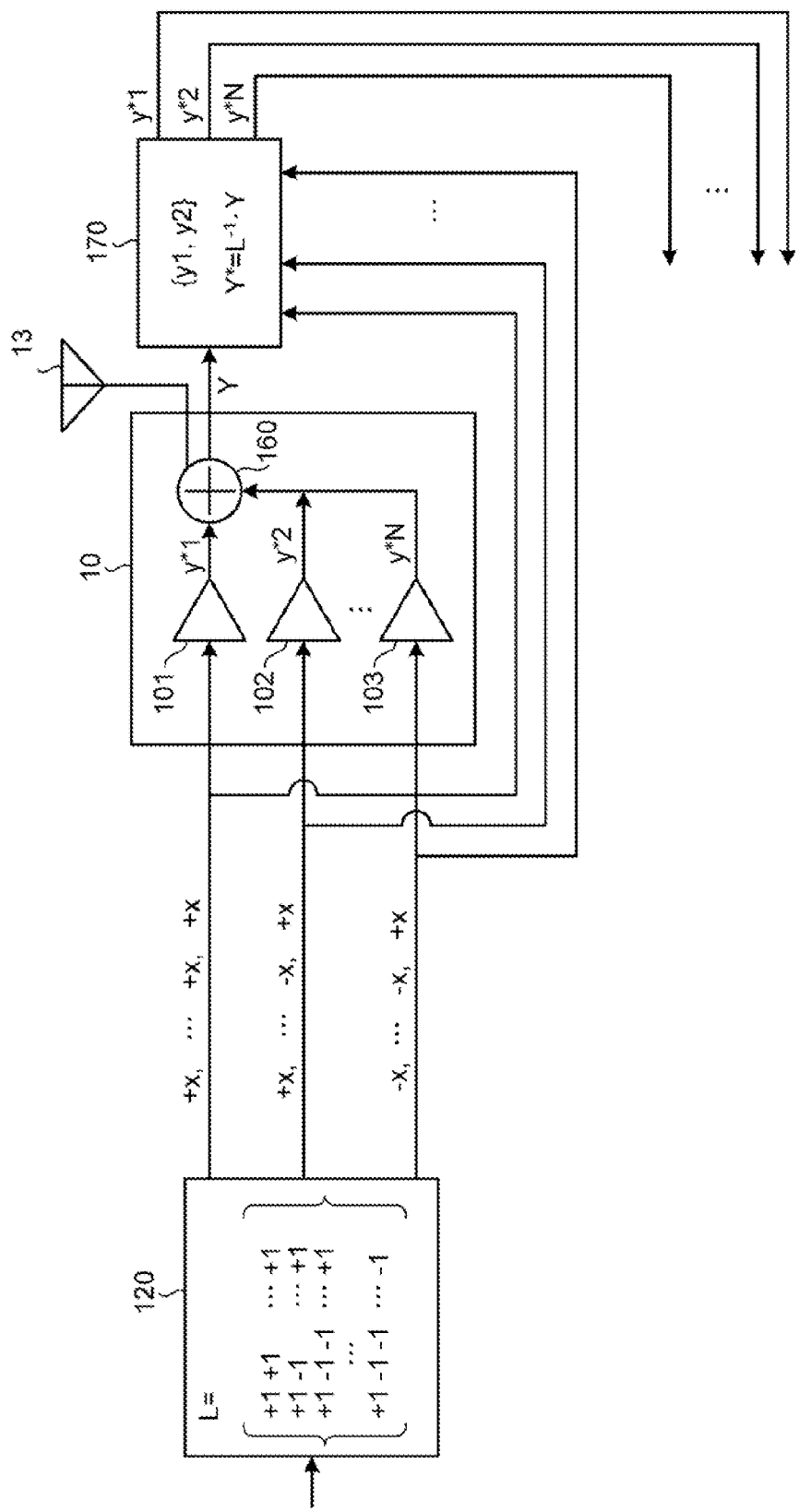
FIG. 7 is a schematic diagram explaining a feedback signal computation process that is performed by the C-HPA according to the second embodiment.

FIG. 7 is a schematic diagram explaining a feedback signal computation process that is performed by the C-HPA according to the second embodiment. The C-HPA according to the present embodiment is different from that of the first embodiment in that signals that can be used for computing feedback signals are acquired from a normal transmission data signal. A normal transmission data signal is not a signal that is generated to compute feedback signals. Hereinafter, it is mainly explained about the specification and acquisition of signals that are used for computing feedback signals in a feedback signal computation mode in the C-HPA according to the present embodiment. Because signal transmission mode operations of the C-HPA according to the present embodiment are the same as those of the first embodiment, their descriptions are omitted. In FIG. 7, units having the same symbols as those of FIG. 4 have the same functions unless they are particularly explained. Moreover, in FIG. 7, a symbol "+" is added to "x" and "1" for easier comprehension. However, the following descriptions may omit the symbol "+" in some cases.

The signal distributor 120 receives a signal from the multiplier 11. In this case, the signal received by the signal distributor 120 from the multiplier 11 is a normal transmission data signal. The signal is not a signal that is particularly generated to compute feedback signals. Therefore, It is difficult for the signal distributor 120 and the solver 170 to previously grasp what values are included in the signal received by the signal distributor 120 from the multiplier 11.

The signal distributor 120 divides the signal input from the multiplier 11 into N signals. The signal distributor 120 then outputs the divided signals to the individual amplifiers 100. Furthermore, the signal distributor 120 outputs the divided signals to the solver 170. In this case, the signals output from the signal distributor 120 are actually input into the amplifiers 100 via the multipliers 150. However, because the multipliers 150 only transfer the signals, the illustration and explanation for the multipliers 150 are omitted.

The individual amplifiers 100 amplify the signals input from the signal distributor 120 and output the amplified signals.

The coupler 160 acquires the signals output from the individual amplifiers 100. Then, the coupler 160 couples the signals output from the individual amplifiers 100 to generate an output signal. Then, the coupler 160 outputs the generated output signal to the solver 170.

The solver 170 previously stores signal patterns that are used for computing feedback signals. In the present embodiment, the solver 170 stores N patterns such as a pattern in which all of N signals are "x" and a pattern in which the 1st and (k+1)th to N-th (2≤k≤N) signals are "x" and the 2nd to k-th signals are "−x". In other words, patterns of N signals x1, x2, . . . , xN stored in the solver 170 can be expressed like x1={x, x, . . . , x}, x2={x, −x, . . . , x}, . . . , and xN={x, −x, . . . , −x}. In the present embodiment, if "x" is not zero, it is not particularly limited. Hereinafter, the pattern of the signal xi may be referred to as a "pattern xi".

The solver 170 receives the output signal from the coupler 160. The solver 170 further receives the signals output from the signal distributor 120 that correspond to the output signal.

Then, the solver 170 determines which of the stored patterns {x1, x2, . . . , xN} is identical to the pattern of the signal output from the signal distributor 120. When the pattern of the signal output from the signal distributor 120 is not identical to any of the stored patterns, the solver 170 discards the output signal received from the coupler 160. On the contrary, when the pattern of the signal output from the signal distributor 120 is identical to any one of the stored patterns, the solver 170 stores the output signal received from the coupler 160 in association with the signal pattern. Specifically, the solver 170 stores an output signal corresponding to a signal pattern xi (1≤i≤N) as yi. In this case, assuming that the output of the j-th amplifier 100 is y*j=f(x) (1≤j≤N), it is expressed like y1=y*1+y*2+ . . . +y*N, y2=y*1−y*2+ . . . +y*N, . . . , and yN=y*1−y*2− . . . −y*N.

At this time, until signals yi corresponding to all signal patterns xi are acquired, the solver 170 repeats reception of signals output from the coupler 160. When the signals yi corresponding to all the signal patterns xi are acquired, the solver 170 treats all the signals yi as Y={y1, y2, . . . , yN}. Then, the solver 170 computes Y*={y*1, y*2, . . . , y*N} that are the outputs of the individual amplifiers 100 by using Y*=L⁻¹Y. In this case, a matrix "L" is an N*N matrix that is created by arraying N elements of xi on the i-th row and dividing the arrayed elements by "x". The matrix "L" is a matrix that is expressed by the mathematical expression (1). At this time, the solver 170 treats y*i as the feedback signal of the i-th amplifier 100. Then, the solver 170 transmits the feedback signal y*i to the i-th subtracter 130.

The individual subtracters 130 stores the feedback signals received from the solver 170.

Figure 8:
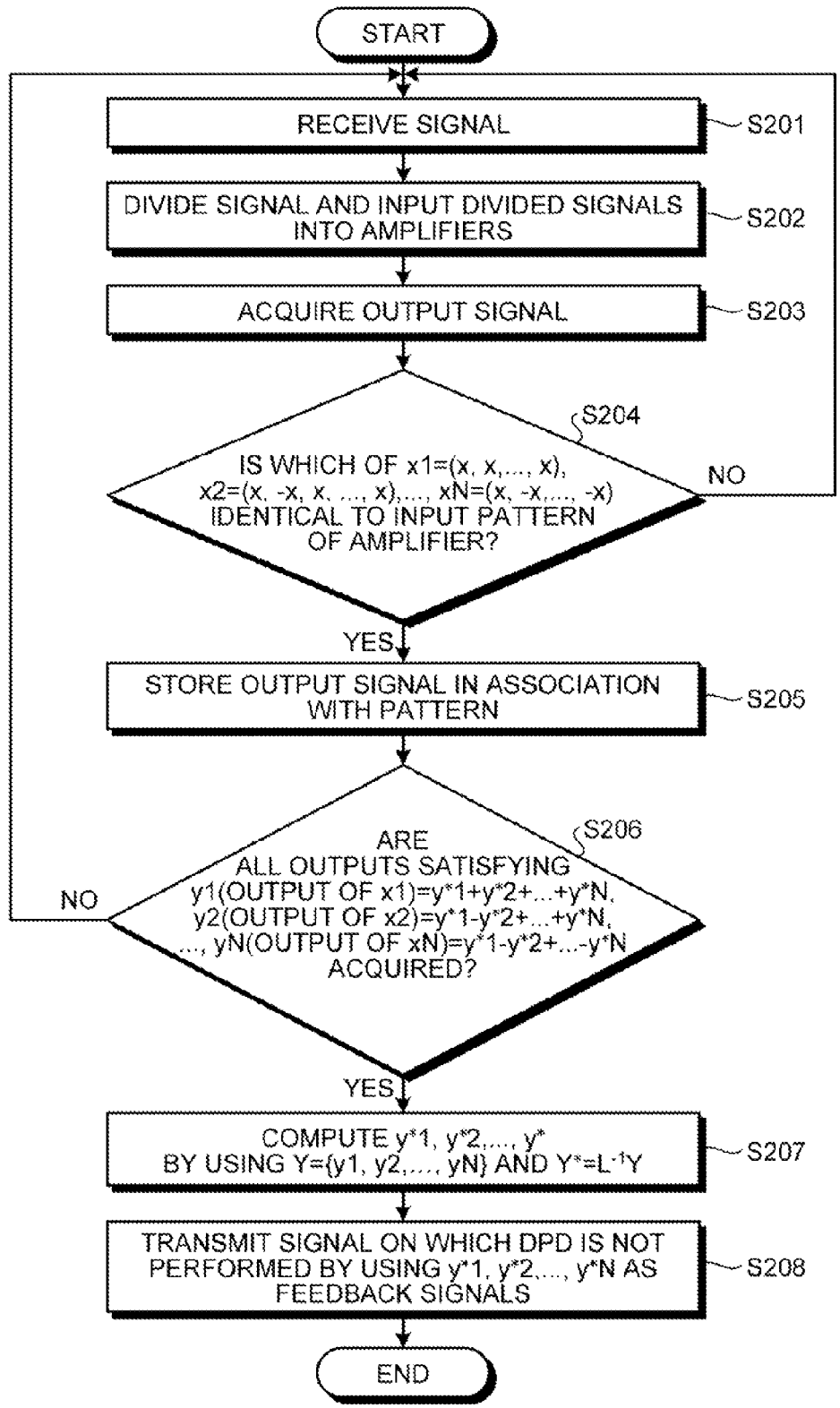
FIG. 8 is a flowchart explaining a distortion compensation process that is performed by the C-HPA according to the second embodiment.

Next, it will be explained about a flow of a distortion compensation process that is performed by the C-HPA according to the present embodiment with reference to FIG. 8. FIG. 8 is a flowchart explaining a distortion compensation process that is performed by the C-HPA according to the second embodiment.

The signal distributor 120 receives a signal from the multiplier 11 (Step S201). Then, the signal distributor 120 divides the received signal and inputs the divided signals into the individual amplifiers 100 (Step S202).

The individual amplifiers 100 amplify the input signals and output the amplified signals to the coupler 160. The coupler 160 couples the signals received from the individual amplifiers 100 to generate an output signal. Then, the solver 170 acquires the output signal from the coupler 160 (Step S203).

The solver 170 determines which of the stored patterns {x1, x2, . . . , xN} is identical to the signal pattern that is output from the signal distributor 120 and is input into the amplifier 100 (Step S204). When the signal pattern is not identical to any of the stored patterns {x1, x2, . . . , xN} (Step S204: NO), the process control returns to Step S201. At this time, the solver 170 discards the output signal.

On the contrary, when the signal pattern is identical to any one of the stored patterns {x1, x2, . . . , xN} (Step S204: YES), the solver 170 stores the signal yi in association with the identical pattern xi (Step S205).

The solver 170 determines whether all the signals yi identical with the stored patterns xi are acquired (Step S206). In other words, assuming that the output of the j-th amplifier 100 is y*j=f(x), the solver 170 determines whether all output signals satisfying expressions of y1=y*1+y*2+ . . . +y*N, y2=y*1−y*2+ . . . +y*N, . . . , yN=y*1−y*2− . . . −y*N are acquired. When the acquisition of the signals yi identical with individual patterns xi is not completed (Step S206: NO), the process control returns to Step S201.

On the contrary, when all the signals yi identical with the individual patterns xi are acquired (Step S206: YES), the solver 170 treats the signals yi as Y={y1, y2, . . . , yN}. Then, the solver 170 computes Y*={y*1, y*2, . . . , y*N} that are the outputs of the individual amplifiers 100 by using $Y^*=L^{-1}Y$ (Step S207).

The i-th ($1 \le i \le N$) subtracter 130 subtracts the feedback signal y*i from the signal si input from the signal distributor 120 to obtain an error signal. The i-th LMS processor 140 performs an LMS process on the error signal to compute a correction (predistortion) signal hi. Then, the LMS processor 140 outputs the correction signal hi to the i-th multiplier 150. The i-th multiplier 150 multiplies the input signal xi by the correction signal hi. Then, the i-th amplifier 100 amplifies the signal input from the multiplier 150 to generate a signal pi. Then, the coupler 160 couples the signals p1 to pN input from the individual amplifiers 100 to generate a transmitting signal P. Then, the coupler 160 transmits the transmitting signal P through the antenna 13 (Step S208).

As described above, the C-HPA according to the present embodiment can obtain the outputs of the individual HPAs on the basis of an output signal of the C-HPA without generating specific signals. As a result, the C-HPA does not require a function for generating specific signals and thus the size of a transmitter can be reduced.

Moreover, because it is not required that tap couplers for using the outputs of the individual HPAs as feedback signals are arranged even when a DPD technique is used, the size of C-HPA can be reduced, a manufacturing cost can be suppressed, and further reliability can be improved. In other words, according to the C-HPA of the present embodiment, the reduction of a size, the reduction of a manufacturing cost, and the improvement of reliability can be realized without losing linearity and power efficiency of a high power amplifier.

Figure 9:
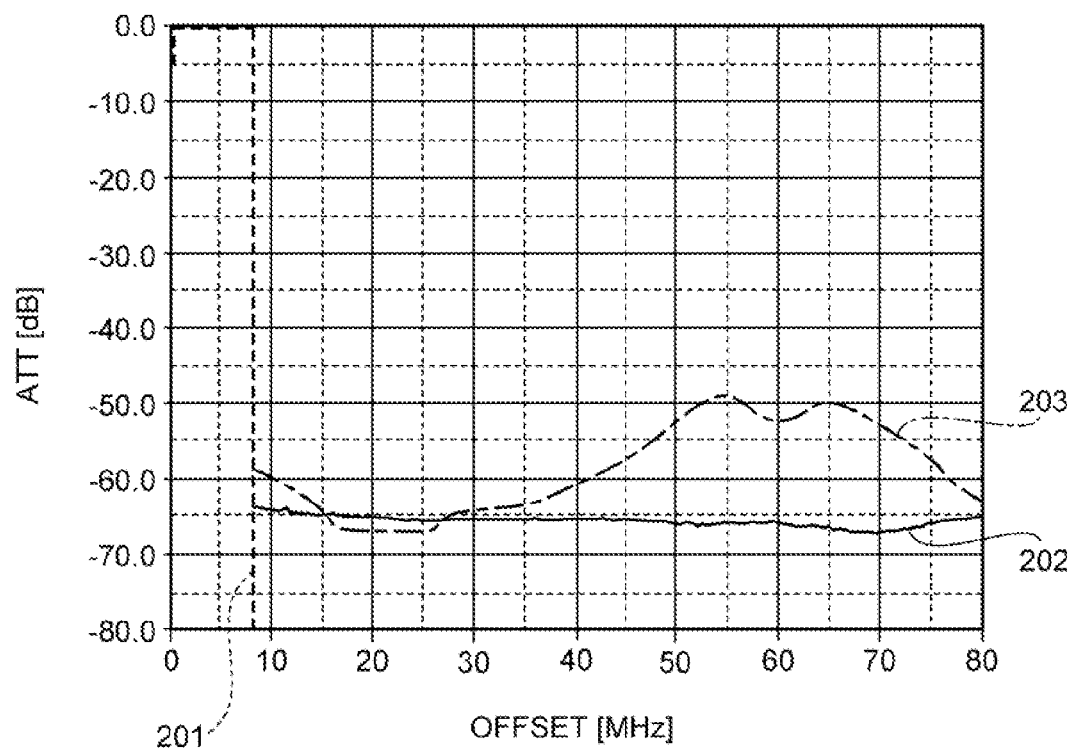
FIG. 9 is a diagram explaining a distortion removal effect when using the C-HPA according to the present embodiment.
Figure 10:
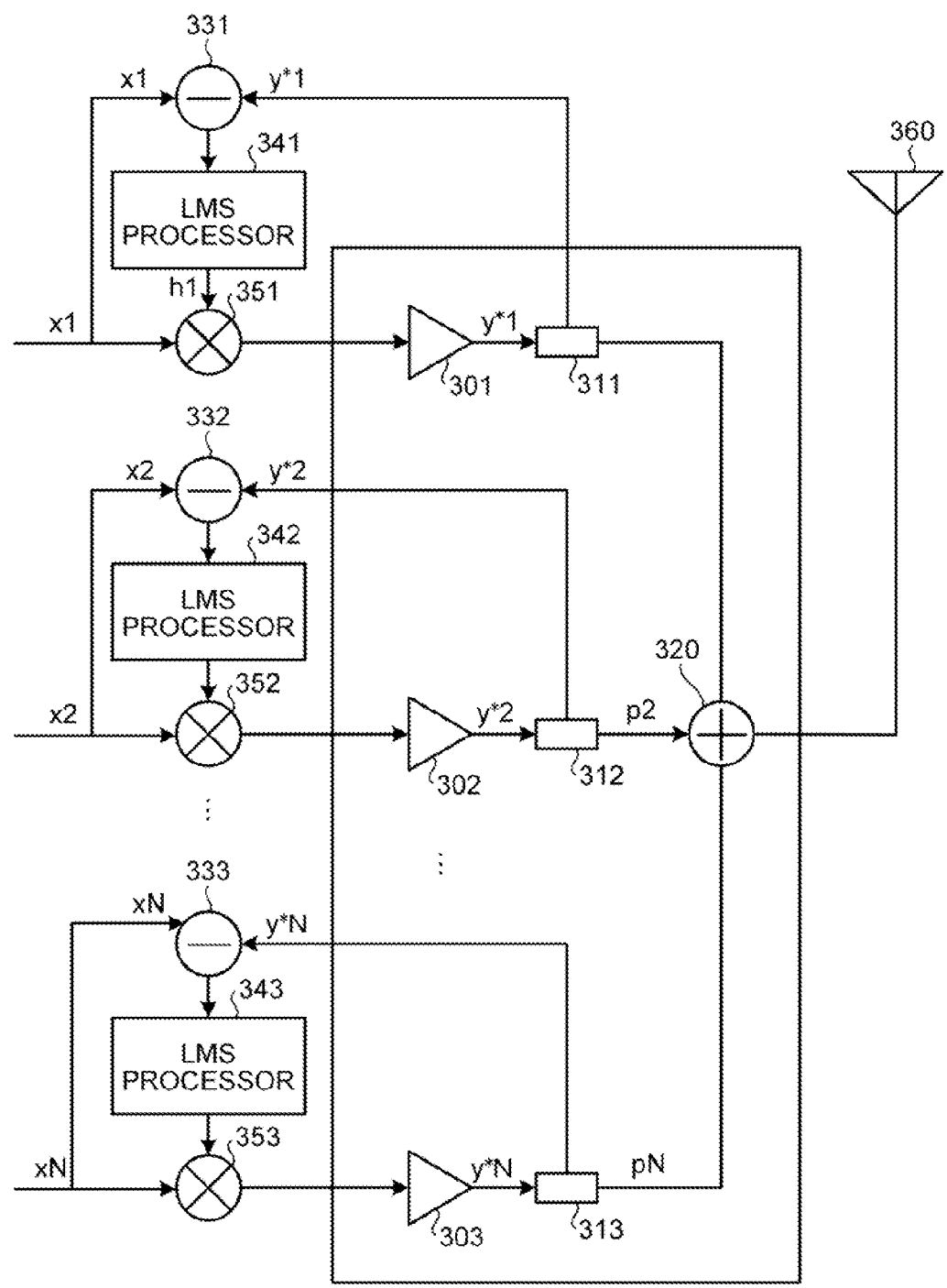
FIG. 10 is a diagram explaining a conventional example.

It will be further explained about an example of a distortion removal effect when using the C-HPA according to the embodiments with reference to FIG. 9. FIG. 9 is a diagram explaining a distortion removal effect when using the C-HPA according to the present embodiment.

The vertical axis of a graph illustrated in FIG. 9 indicates an attenuation of a signal and the horizontal axis indicates an offset from a center frequency. A spectrum of an original signal is indicated with a dotted line 201. Fundamentally, when an original signal is output, a signal having an offset frequency larger than that of the dotted line 201 is unnecessary. However, when it is expected to output an original signal, a surplus signal occurs from a portion having an offset frequency larger than that of the dotted line 201. Specifically, a signal indicated with a solid line 202 occurs when signals are amplified by using the C-HPA of the first embodiment or the second embodiment. On the other hand, a signal indicated with a chain line 203 occurs when signals are amplified without using the C-HPA of the first embodiment or the second embodiment. When normal amplification is performed as indicated with the chain line 203, a specific frequency has a low attenuation so as to output a large signal. On the contrary, when signals are amplified by using the C-HPA of the first embodiment or the second embodiment, all frequencies of surplus offsets can have a high attenuation and thus unnecessary signals can be suppressed compared to the normal amplification.

According to an aspect of a composite amplifier, a transmitter, and a composite amplifier control method disclosed in the present application, signal distortions caused by individual amplifiers can be removed by using a signal that is obtained by coupling the outputs of the individual amplifiers. As a result, because tap couplers corresponding to the outputs of the individual amplifiers are not required, the size of the composite amplifier can be reduced, a manufacturing cost can be suppressed, and further reliability can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A composite amplifier comprising:
    N amplifiers that sequentially receive N input signals to amplify and output the respective amplified N element signals of each of the N input signals, N being an integer greater than 1;
    a signal generator that generates a first signal that has signals having the predetermined value that are input into the amplifiers and a k-th signal that has signals having the predetermined value that are input into the first amplifier and the (k+1)th (k=2 to N−1) to N-th amplifiers and signals having an inverse value of the predetermined value that are input into the second to k-th amplifiers;
    an signal distributor that sequentially outputs the first to N-th signals in which a predetermined matrix is a mathematical expression (1) and which are acquired from the signal generator to the amplifiers, and $$L = \begin{Bmatrix} +1 & +1 & & \dots & +1 \\ +1 & -1 & & \dots & +1 \\ +1 & -1 & -1 & \dots & +1 \\ & & \dots & & \\ +1 & -1 & -1 & \dots & -1 \end{Bmatrix}; \qquad (1)$$

a signal adder that adds the amplified N element signals for each the input signal;
    a feedback signal computer that multiplies an N-dimension vector, which is obtained by sequentially arraying addition results of the outputs for each of the input signals, by the inverse matrix of the predetermined matrix and computes the feedback signals for the amplifiers; and
    a corrector that corrects signal distortions of the amplifiers by using the feedback signals.

2. The composite amplifier according to claim 1, wherein the corrector includes:
    each of first to N-th error signal computers that computes an error signal between an input signal and the feedback signal;
    each of first to N-th least mean square (LMS) processors that computes a correction signal for compensating for a distortion characteristic component of the amplifiers on the error signal by using an LMS algorithm; and each of first to N-th multipliers that multiplies the input signal by the correction signal and inputs the multiplied signal into the amplifiers.

3. The composite amplifier according to claim 1, wherein the signal generator adds the first to N-th signals to a header part of transmission data and transmits the transmission data to the signal distributor.

4. A transmitter comprising:

N amplifiers that sequentially receive N input signals to amplify and output the respective amplified N element signals of each of the N input signals, N being an integer greater than 1;

a signal generator that generates a first signal that has signals having the predetermined value that are input into the amplifiers and a k-th signal that has signals having the predetermined value that are input into the first amplifier and the (k+1)th (k=2 to N−1) to N-th amplifiers and signals having an inverse value of the predetermined value that are input into the second to k-th amplifiers;

an signal distributor that sequentially outputs the first to N-th signals in which a predetermined matrix is a mathematical expression (1) and which are acquired from the signal generator to the amplifiers, and $$L = \begin{pmatrix} +1 & +1 & & \ldots & +1 \\ +1 & -1 & & \ldots & +1 \\ +1 & -1 & -1 & \ldots & +1 \\ & & \ldots & \\ +1 & -1 & -1 & \ldots & -1 \end{pmatrix}; \quad (1)$$

a signal adder that adds the amplified N element signals for each of the input signals;

a feedback signal computer that multiplies an N-dimension vector, which is obtained by sequentially arraying addition results of the outputs for each of the input signals, by the inverse matrix of the predetermined matrix and computes the feedback signals for the amplifiers;

a baseband signal generator that generates a baseband signal;

an RF signal generator that converts the baseband signal into an RF signal;

a corrector that corrects distortions of the RF signals of the amplifiers by using the feedback signals; and a signal transmitter that adds the outputs of the amplifiers obtained by amplifying the RF signals to generate a transmitting signal and transmits the transmitting signal via an antenna.

5. A composite amplifier control method comprising:

generating a first signal that has signals having the predetermined value that are input into N amplifiers and a k-th signal that has signals having the Predetermined value that are input into the first amplifier and the (k+1)th (k=2 to N−1) to N-th amplifiers and signals having an inverse value of the predetermined value that are input into the second to k-th amplifiers, N being number of some sorts;

sequentially outputting the first to N-th signals in which a predetermined matrix is a mathematical expression (1) and which are acquired from the generating to the amplifiers, and $$L = \begin{pmatrix} +1 & +1 & & \ldots & +1 \\ +1 & -1 & & \ldots & +1 \\ +1 & -1 & -1 & \ldots & +1 \\ & & \ldots & \\ +1 & -1 & -1 & \ldots & -1 \end{pmatrix}; \quad (1)$$

respectively amplifying the N element signals by N amplifiers;

adding the amplified N element signals by the amplifiers for each of the input signals;

computing feedback signals for the amplifiers by using an addition result of the outputs for each of the input signals and an inverse matrix of the predetermined matrix; and correcting signal distortions of the amplifiers by using the feedback signals.

* * * * *